United States Patent [19]

Malecki et al.

[11] 4,426,628

[45] Jan. 17, 1984

[54] MILLIMETER WAVE OSCILLATOR WITH ENHANCED DIELECTRIC COUPLER

[75] Inventors: Edmund E. Malecki, Rumson; Harold Jacobs, West Long Beach, both of N.J.

[73] Assignee: The United States of America as represented by the Secretary of the Army, Washington, D.C.

[21] Appl. No.: 246,511

[22] Filed: Mar. 23, 1981

[51] Int. Cl.³ .......................... H03B 7/14; H03B 9/14
[52] U.S. Cl. ............................... 331/96; 331/107 DP; 331/107 SL; 333/250; 333/254
[58] Field of Search ............ 331/96, 99, 101, 107 DP, 331/107 SL, 107 C, 117 D; 333/254, 250

[56] References Cited

U.S. PATENT DOCUMENTS

| | | | |
|---|---|---|---|
| 3,986,153 | 10/1976 | Kuno et al. | 331/107 SL X |
| 4,006,425 | 2/1977 | Chang et al. | 331/96 X |
| 4,048,589 | 9/1977 | Knox et al. | 331/96 X |
| 4,053,897 | 10/1977 | Nerheim | 331/107 DP X |
| 4,259,647 | 2/1981 | Chang et al. | 331/96 |

Primary Examiner—Siegfried H. Grimm
Assistant Examiner—W. R. Paxman
Attorney, Agent, or Firm—Robert P. Gibson; Jeremiah G. Murray; Edward Goldberg

[57] ABSTRACT

A low cost arrangement for a millimeter wave solid state diode oscillator, which obviates precise machining and uses a dielectric transmission line associated with a resonant cavity. Coupling and impedance matching are greatly facilitated by a conductive stripe structure on the end of the dielectric transmission line, extending into the resonant cavity of the solid state oscillator. Fine tuning is provided by a mechanical slide screw. Two layers of shielding surrounding the resonant cavity are provided by a convenient package suitable for various applications of the millimeter wave oscillator wherein leakage radiation is not permitted.

12 Claims, 4 Drawing Figures

MILLIMETER WAVE OSCILLATOR WITH ENHANCED DIELECTRIC COUPLER

The invention described herein may be manufactured and used by or for the Government for Governmental purposes without the payment of any royalties thereon or therefor.

TECHNICAL FIELD

This invention relates to microwave diode radio frequency oscillators and, more particularly, to millimeter wave oscillators utilizing dielectric waveguides.

BACKGROUND OF THE INVENTION

Conventional millimeter wave oscillators use a high frequency device, such as a Gunn or impatt diode, which oscillates in a metal cavity. In the frequency range of 35 GHz to 300 GHz, there are numerous applications for local oscillators for receivers and transmit/-receive functions in radar such as self oscillating mixers. Since such applications are typically low power, it would be highly desirable to obtain these oscillators at low cost. Unfortunately, the high operating frequencies with their attendant short wavelengths requires ultra precision machining so that a reliable metal cavity oscillator for this frequency range may cost generally on the order of three thousand dollars which severely limits its use to only those applications economically justifiable.

Since dielectric waveguides employ evanescant transmission modes for the E and the H fields, precision boundaries are not required for the dielectric waveguides as is required for metal boundaries or walls. However, there are a number of difficulties in the deployment of dielectric waveguides. Although the loss is negligible in passive dielectric transmission lines, there is a power loss in the region of the oscillator due to leakage radiation. Typically, there is little or practically no tuning capacity. The presence of these deficiencies renders known dielectric arrangements low in power output, generally at output one milliwatt.

It is a primary object of this invention to provide a low cost millimeter wave oscillator having a simplified circuit package with good power output capability.

It is a related object to provide a millimeter wave oscillator wherein dimensions are not critical.

Another object of the invention is to increase the coupling efficiency between an oscillating device and a passive dielectric transmission line at a desired frequency with nearly fixed impedance so that required tuning is minimized.

A still further object is to provide a low cost millimeter wave oscillator which may be tuned, if desired, to provide a certain latitude of flexibility.

SUMMARY OF THE INVENTION

In an illustrative embodiment of the invention a device capable of producing wave energy is located in a resonant cavity having at least one portion occupied by a dielectric transmission medium with an arrangement for enhancing radio frequency coupling between it and the resonant cavity. The arrangement includes a plurality of metallic stripes parallel to each other and displaced in a direction corresponding to the flow of wave energy. The resonant cavity includes a metallic resonant disc mounted over the pellet shaped diode as it sits on a conductive heat sink. The resonant cavity is housed in a metallic package with a port for the wave energy and an internally mounted waveguide to provide an initial metallic shield around the resonant cavity.

A metal disc movable in the vicinity of the resonant cavity provides means for tuning the oscillation frequency of the device which is a solid state diode. Gunn type diodes and impatt diodes may be used. In addition to increasing the output power of the diode, the transformer type launch on the dielectric transmission medium provides a latitude of flexibility in its design terminating in the region of the resonant cavity.

BRIEF DESCRIPTION OF THE DRAWINGS

A more complete understanding of the invention and the various features, additional objects and advantage thereof may be more readily appreciated and better understood by reference to the following detailed description to conjunction with the following drawings wherein.

DETAILED DESCRIPTION

Figure 1:
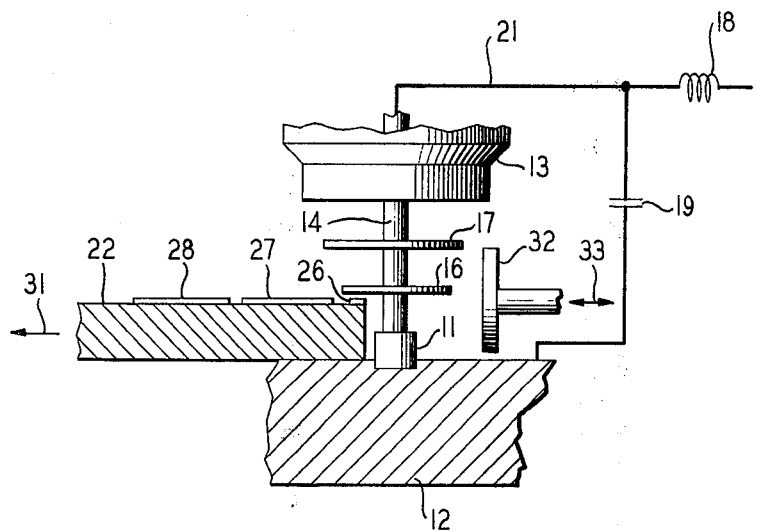
FIG. 1 is an enlarged diagram illustrating the relative position of component parts of an illustrative embodiment of the invention.

FIG. 1 serves to illustrate the physical relationship of the electrical components of a millimeter wave oscillator employing the inventive principles. In FIG. 1, solid state diode 11 rests in a small cylindrical cavity in heat sink 12 (shown in cross section) which readily accommodates the base, or bottom terminal, of the pellet shaped diode. Above diode 11, a portion of a modified RF connector 13 is shown whose center conductor in the form of metal post 14 extends down to make electrical contact to the top terminal of diode 11. On post 14, disc 16 soldered to post 14 serves as a resonant disc while forming a resonant cavity between it and the ground plane provided by the outer surface of heat sink 12 in the vicinity of the base of diode 11. Between disc 16 and connector 13, also on post 14, disc 17, slightly larger than disc 16, serves to form a choke type assembly to minimize radiation loss to connector 13 which provides a suitable direct current bias potential for diode 11. Inductor 18 and capacitor 19 provide an RF choke for the DC bias supplied to the diode 11 via conductor 21 which may actually be in the form of a suitable coaxial line.

In FIG. 1, the resonant cavity which surrounds diode 11 has dielectric waveguide 22 (shown in cross section) extending therefrom. On the upper surface of dielectric waveguide 22 a plurality of metal strips, or stripes, starting with stripe 26 through to stripe 28 serve to promote highly efficient radio frequency coupling from the resonant cavity and diode 11 to the waveguide. Metal stripes 26–28 on dielectric waveguide 22 serve as a transformer, launching the radio frequency wave energy into the dielectric waveguide radiating in the direction of arrow 31. Also, the transformer effect of metal stripes 26–28 on dielectric waveguide 22 provides effective impedance matching between resonator disc 16 with diode 11 and the dielectric medium of the waveguide.

The final component in FIG. 1 is disc shaped head portion 32 of a mechanical slide screw tuner which is adjustable along its axis in accordance with double headed arrow 33. It should be pointed out that the position of tuning disc head 32 has a secondary effect on the oscillating frequency of diode 11 demonstrated by a relatively small change in frequency. This characteristic indicates an inherently high Q resonant oscillating circuit for diode 11 with good overall efficiency.

Figure 2:
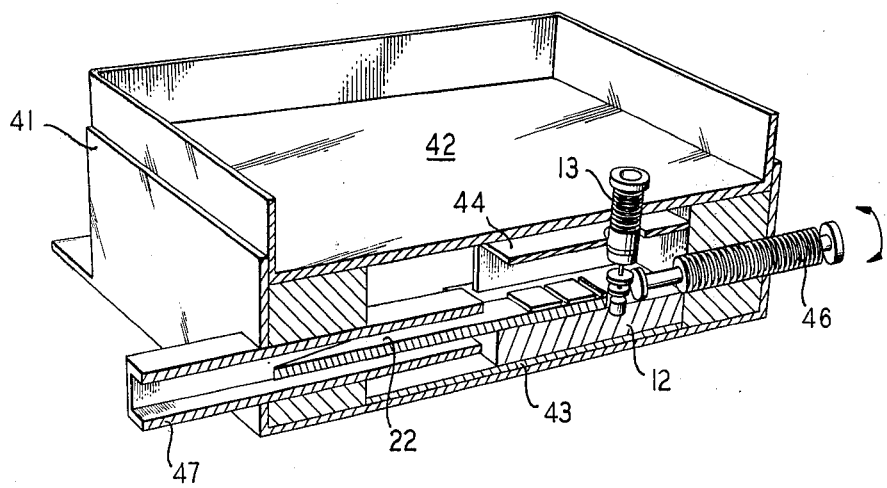
FIG. 2 is a sectional perspective view of a typical package for an application of the invention.

FIG. 2 depicts the arrangement of FIG. 1 in a suitable metal package shown in perspective with a sectional view taken along the axis which longitudinally runs through the oscillator corresponding to the orientation of dielectric waveguide 22. The basic component of the package is metal enclosure 41 designed to accept metal cover 42. In a hole in cover 42 is mounted connector 13. Between heat sink 12 and the bottom portion of metal enclosure 41 is carrier substrate 43. Carrier substrate 43 is a rectangular shaped plate of alumina or other type of ceramic material. Carrier substrate 43 is then metallized by well known techniques to provide it when an exterior surface on its upper and lower sides of gold. Heat sink 12 is fastened on the upper surface extending from the central region of one edge toward the central portion on the upper surface. As may be seen in FIG. 2, cross sectioned metal waveguide member 44 has a clearance hole for connector 13 and runs from the transformer launching section of dielectric waveguide 22 to the extended end portion of mechanical slide screw tuner 46 terminating with disc head 32 (see FIG. 1) to provide a first metal enclosure. Since the cross section of waveguide 44 is taken along a vertical plane through the longitudinal center line, its completed shape is in the form of an inverted letter U. Of course, the enclosure formed by base 41 and cover 42 provides a second layer of shielding for the oscillator circuit of diode 11. This dual shielding serves to substantially minimize radiation and a power loss and thus helps to enhance efficiency. The RF energy from diode 11 is thus effectively coupled to dielectric waveguide 22 and thence into waveguide member 47 (also shown in cross section) for extending it to other components.

In the construction and material selection of the package of FIGS. 1 and 2 a procedure was used to avoid high fabrication costs while providing stable operating performance and physical sturdiness. Diode 11 may be either a gallium arsenide or indium phosphide solid state diode that is centrally located in a quartz ring having gold plated cap and base made of copper. Heat sink 12 accommodates the base of diode 11 in the previously mentioned vertical hole and is soldered in place to provide a band of high thermal and good electrical conductivity. Gold plated copper, or other suitable material of high thermal conductivity, is preferred for heat sink 12. Next, a conductive silver epoxy, such as commercially available "Ablestick 71-1" may be used to fasten dielectric waveguide 22 to heat sink 12. The epoxy is baked at appropriate temperatures to cure it. Utilization of a solder flow technique may be used to attach the subassembly composed of diode 11, dielectric waveguide 22 and heat sink 12 to metallized alumina carrier substrate 43.

Figure 3:
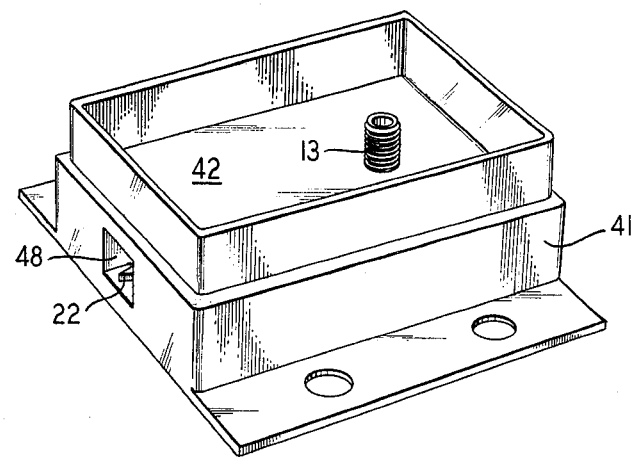
FIG. 3 is a perspective of the full package of the FIG. 2 without a waveguide section attached to the radio frequency port.

FIG. 3 depicts a full perspective view of the complete package of FIG. 1. As may be observed, connector 13 is located in cover 42 which fits into body member 41. Here, however, waveguide 47 is absent exposing port 48 wherein the tapered tip of dielectric waveguide 22 is shown. Operation of millimeter wave oscillator of FIG. 3 may be obtained with the tapered end of dielectric waveguide 22 acting as an antenna. This arrangement will provide approximately from 10 to 18 dB of gain at V-band frequencies.

Figure 4:
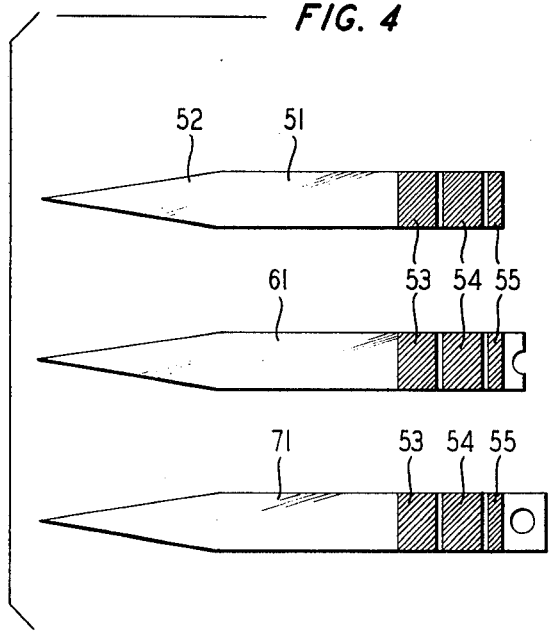
FIG. 4 illustrates some of the optional configurations for the dielectric transmission line employing transformer stripe launches.

FIG. 4 illustrates a number of possible variations for dielectric waveguide 22. In this case, dielectric waveguide 51 is a slightly enlarged version of dielectric waveguide 22 so that both have the same shape. Waveguide 51 is tapered to a point at end 52 opposite from the end with transformer stripes 53-55. Dielectric waveguide 61 and 71 are respectively designed to either fit against the outer circular surface of diode 11 or to embed the diode in the dielectric material. It has been demonstrated that the presence of the transformer stripes of the dielectric waveguides of FIG. 4 provides a great deal of freedom of choice in the actual shape of the end associated with diode 11. In all cases, the presence of the transformer stripes significantly increases power output from the millimeter wave oscillator. At freqencies of about 60 GHz a power output of ten milliwatts was produced. When the appropriate dimensions of the transformer stripes are established for a physical oscillator structure, suitable permanent metallization techniques on the dielectric waveguide may be used to insure good bias and low skin effect losses to provide maximum radiant energy coupling to the dielectric.

Another variation is in the number of transformer stripes being used to provide the launching. Certainly, those skilled in the art may use more or less for a given package design in accordance with the inventive principles presented herein.

An advantage of this arrangement is that the dimensions are not critical since the dielectric transmission line absorbs essentially all of the radio wave energy. Accordingly, propagation of this wave energy in the dielectric is in the evanescent mode where the field energy is not critical at the boundaries of the material. In this case, the dielectric transmission line has a dominating effect on the small resonant cavity formed between resonant disc 16 and heat sink 12 thereby rendering its dimensions non-critical. This serves to permit higher variations in mechanical tolerances without attendant effects on frequency and performance of the oscillator. Of course, this characteristic helps to significantly reduce the manufacturing cost of working units. Also, the dielectric transmission line may be constructed of a number of materials. In the case of alumina or silicon, it may be machined to shape. Optionally, it may be cast or molded into shape using Stycast epoxy or it in combination with high concentration of boron nitride.

In all cases, the illustrative embodiments presented herein are merely a few of those possible variations which will occur to those skilled in the art while utilizing the inventive principles. For example, the dimensions of the metal package may be on the order of one-third smaller in the interest of minimizing energy losses due to multi-modal reflections from the walls of the outer box. Metallization of the underside of the dielectric transmission line and soldering same to the diode heat sink block may be more desirable from a manufacturing and performance standpoint. In some applications, the metal enclosure may be unnecessary, such as beacon applications or where the oscillator is required as a separate assembly to be placed in a waveguide at the discretion of the user. Accordingly, numerous variations of the invention are possible while staying within the spirit and scope of the invention as defined in the following claims.

What is claimed is:

1. An oscillator comprising an active device capable of producing wave energy, a resonant cavity formed around said device and including a waveguide, a dielectric transmission medium extending from a portion of said resonant cavity for delivering wave energy to said waveguide, and means mounted on a surface of said dielectric transmission medium for enhancing the coupling of radio frequency energy from said cavity into said dielectric transmission medium to facilitate power transfer and impedance matching between said resonant cavity and said dielectric transmission medium to increase the output power delivered in a first direction to said waveguide, said means for enhancing the coupling including a plurality of parallel metallic stripes spaced apart on said dielectric medium and electrically insulated from each other and displaced therealong in said first direction.

2. An oscillator according to claim 1 wherein said resonant cavity includes a metallic resonant disc displaced from one end of said device and a planar metallic member located at and connected to the opposite end of said device.

3. An oscillator according to claim 2 including a further metallic disc within said cavity displaced from said resonant disc further away from said planar member and providing a choke for minimizing radiation loss.

4. An oscillator according to claim 2 wherein said device is a solid state diode mounted in a pellet shaped package.

5. An oscillator according to claim 4 further comprising a metallic enclosure for housing and shielding said resonant cavity and having a port for said waveguide.

6. An oscillator according to claim 5 further comprising an inner metallic member within said enclosure surrounding and further shielding said resonant cavity and elongated with its longitudinal axis in said first direction.

7. An oscillator according to claim 6 further comprising a movable disc in circuit with said planar metallic member and positioned adjacent said device in the region of said resonant cavity, said disc being adjusted to vary the resonant frequency of said oscillator.

8. An oscillator according to claim 7 wherein said active device is a Gunn diode.

9. An oscillator according to claim 7 wherein said active device is an impatt diode.

10. A source of radio frequency energy comprising a resonant cavity, a biased solid state diode in said resonant cavity, said cavity being formed between a ground plane connected to one terminal of the diode and a resonant disc electrically connected to the other terminal of the diode and physically displaced therefrom, means for extracting power from the resonant cavity including an elongated dielectric transmission medium partially occupying the cavity, said means having a plurality of spaced conductive stripes at one end electrically insulated from one another and mounted transverse to the longitudinal dimensions of the elongated medium, said stripes serving as transformers to match the impedance of the diode and resonant cavity to the dielectric medium thereby enhancing power transfer between said diode and said transmission medium.

11. A source according to claim 10 further comprising a metal housing surrounding and shielding the resonant cavity, said metal housing having a port for the passage of radio frequency energy, and the other end of said dielectric transmission medium having a tapered portion located in the vicinity of said port.

12. A source according to claim 11 wherein said dielectric transmission medium has an opening to accommodate said diode and extends through a major portion of said resonant cavity.

* * * * *